United States Patent [19]

Nettesheim et al.

[11] 4,311,381
[45] Jan. 19, 1982

[54] METHOD AND APPARATUS FOR PRODUCING PRINTING PATTERNS

[75] Inventors: Daniel R. Nettesheim, New Berlin; Robert R. Guyer, Hartland, both of Wis.

[73] Assignee: Schwaab, Inc., Milwaukee, Wis.

[21] Appl. No.: 132,816

[22] Filed: Mar. 24, 1980

[51] Int. Cl.³ ............................................... G03B 27/30
[52] U.S. Cl. .................................... 355/100; 355/132
[58] Field of Search ................... 355/30, 77, 132, 100

[56] References Cited

U.S. PATENT DOCUMENTS 4,087,182 5/1978 Aiba et al. .................. 355/132 X

*Primary Examiner*—Richard A. Wintercorn
*Attorney, Agent, or Firm*—Andrus, Sceales, Starke & Sawall

[57] ABSTRACT

A method and apparatus for producing printing patterns through the use of a liquid photosensitive resin system. A partially cured resin backing member is applied to a vertical supporting surface and a glass cover plate having a photographic negative mounted on the glass surface is positioned in spaced relation to the backing member. A liquid uncured photosensitive resin is introduced into the space between the backing member and the photographic negative, and an ultraviolet lighting unit is then positioned adjacent the glass cover plate to expose portions of the resin to the light through the photographic negative, causing the exposed portions of the resin to cure or crosslink. The lighting unit is oscillated to provide tapered edges on the exposed crosslinked areas of the resin. Following the crosslinking, the pattern can be removed and the uncured portions of the resin can be washed from the pattern.

14 Claims, 7 Drawing Figures

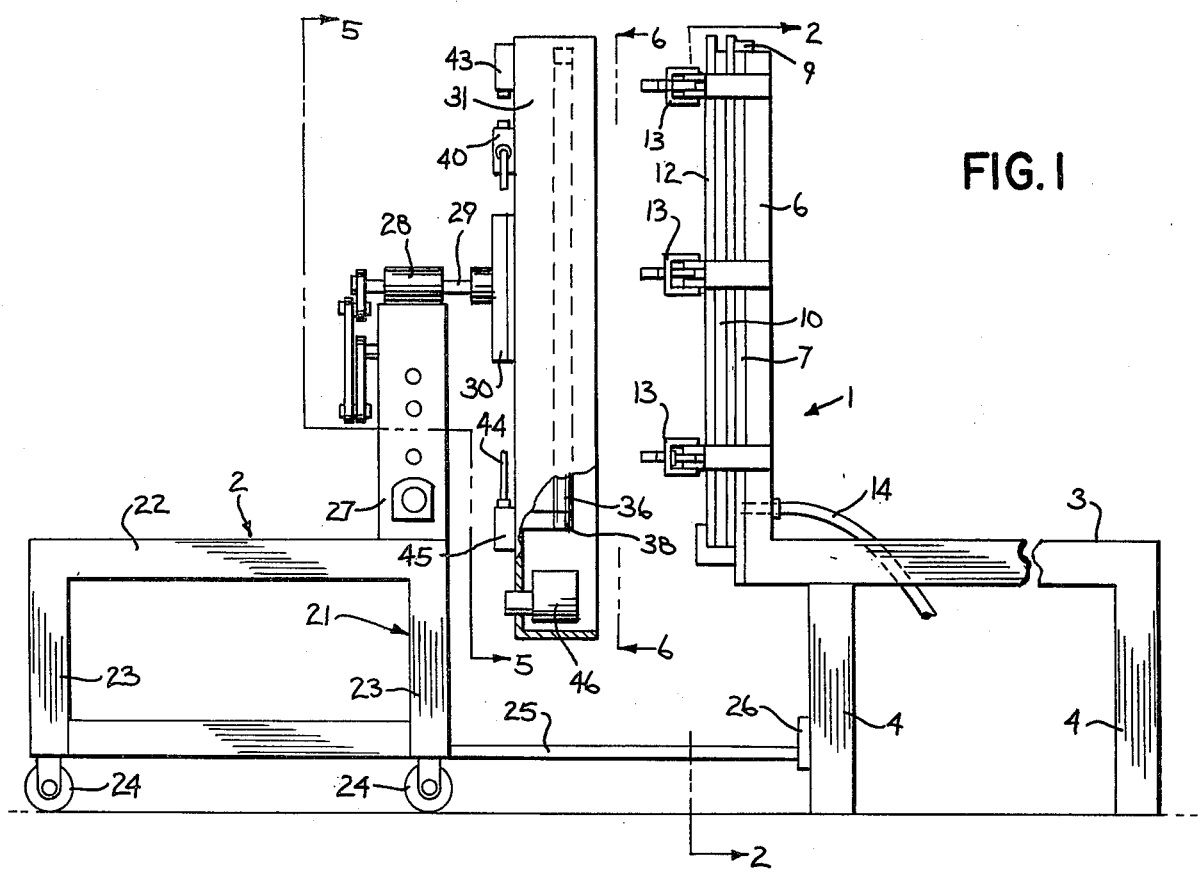
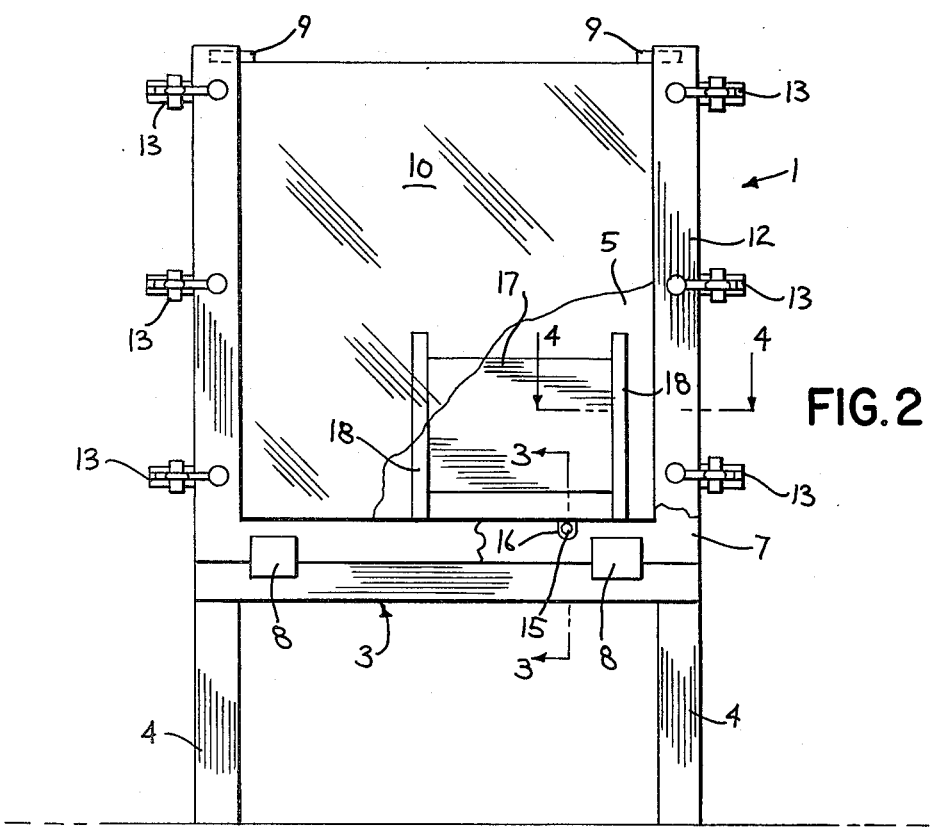

METHOD AND APPARATUS FOR PRODUCING PRINTING PATTERNS

BACKGROUND OF THE INVENTION

In the manufacture of rubber printing plates, a pattern of the characters or material to be printed is produced and a mold is then produced from the pattern. Subsequently, a rubber printing plate is cast from the mold.

Photosensitive resins have been used extensively in the production of patterns. In one system, an uncured photo-sensitive resin is bonded to the surface of a metal backing plate and a photographic negative, bearing the characters to be printed, is applied to the surface of the resin and exposed to ultra-violet light. The areas of the resin exposed through the photographic negative are crosslinked or cured to provide a hardened structure, while the unexposed areas remain soft. Subsequently, the uncured areas can be removed through use of a liquid wash-out solution to provide the pattern.

The photosensitive resin bonded to the metal backing plate is sold in relatively large sheets and is cut to size for the particular printing plate to be produced. The advantages of this type of photosensitive resin system are offset by the high cost of the composite sheets.

Other systems have been used in the past utilizing liquid photosensitive resins. With these systems, a layer of the liquid resin is layed onto a horizontal glass plate, while a photographic negative is applied to the undersurface of the plate. An ultra-violet light unit, located beneath the plate, is employed to crosslink the areas of the resin exposed through the photographic negative. After exposure, the uncured areas of the liquid resin can be readily washed away with a wash solution to provide the pattern.

This liquid resin system has certain inherent disadvantages in that it is limited to a relatively thin resin layer so that the pattern has limited usage and cannot be used to produce printing plates requiring substantial depth of characters, as is necessary when printing corrugated paperboard.

In producing patterns from photosensitive resins, certain portions of the resin will require a longer time of exposure to ultra-violet light than other portions. For example, small characters, such as commas, periods, and the like, require a greater time of exposure than larger characters. Because of this, the normal procedure is to expose the entire negative for a given period of time and then blackout those areas which have had the desired amount of exposure and continue to expose those areas requiring additional time. With a liquid resin system as applied to a horizontal glass plate, it is difficult, is not impossible, to black out certain areas of the negative to vary the time of exposure due to the inaccessible location of the negative.

SUMMARY OF THE INVENTION

The invention is directed to an improved method and apparatus for producing printing patterns through use of a liquid photosensitive resin system. In accordance with the invention, a resin backing sheet is applied to a vertical supporting surface and a glass cover plate having a photographic negative mounted on the glass surface is positioned in spaced relation to the backing sheet. A liquid, uncured photosensitive resin is introduced into the lower end of the space between the photographic negative and the backing sheet and as the resin flows upwardly within the space, the air is displaced.

An ultra-violet lighting unit is then positioned adjacent the glass cover plate and portions of the liquid resin are exposed to the light through the photographic negative, causing the exposed portions to crosslink or cure. The ultraviolet light also acts to fully cure the resin backing sheet to thereby provide an integral cured resin pattern.

The lighting unit includes a series of fluorescent tubes which are mounted in a vertical plane and the unit is oscillated about a horizontal axis to thereby provide tapered edges on the exposed cross-linked areas of the resin.

After crosslinking of the resin, the pattern is removed from the space between the glass cover plate and the supporting surface and the remaining uncured resin is washed from the pattern through use of a washing solution.

The invention provides an inexpensive method of producing patterns for rubber printing plates using a liquid photosensitive resin system. As the negative is positioned in a vertical position against the cover plate, the negative is in an accessible location where portions of the negative can be blacked out to vary the time of exposure of areas of the negative.

By increasing the spacing between the glass plate and the backing member, a pattern of any desired thickness can be obtained.

By oscillating the lighting unit, the edges of each character are uniformly tapered and the taper or draft is desirable to separate the parts in the subsequent molding operations.

Other objects and advantages will appear in the course of the following description.

DESCRIPTION OF THE DRAWINGS

The drawings illustrate the best mode presently contemplated of carrying out the invention.

In the drawings:

FIG. 1 is a side elevation of the apparatus of the invention with parts broken away in section;

FIG. 2 is a view taken along line 2—2 of FIG. 1 with parts broken away in section;

DESCRIPTION OF THE PREFERRED EMBODIMENT

FIG. 1 illustrates an apparatus for producing printing patterns through the use of a liquid photosensitive resin. In general, the apparatus includes a pattern making unit 1 and a mobile lighting unit 2.

Figure 4:
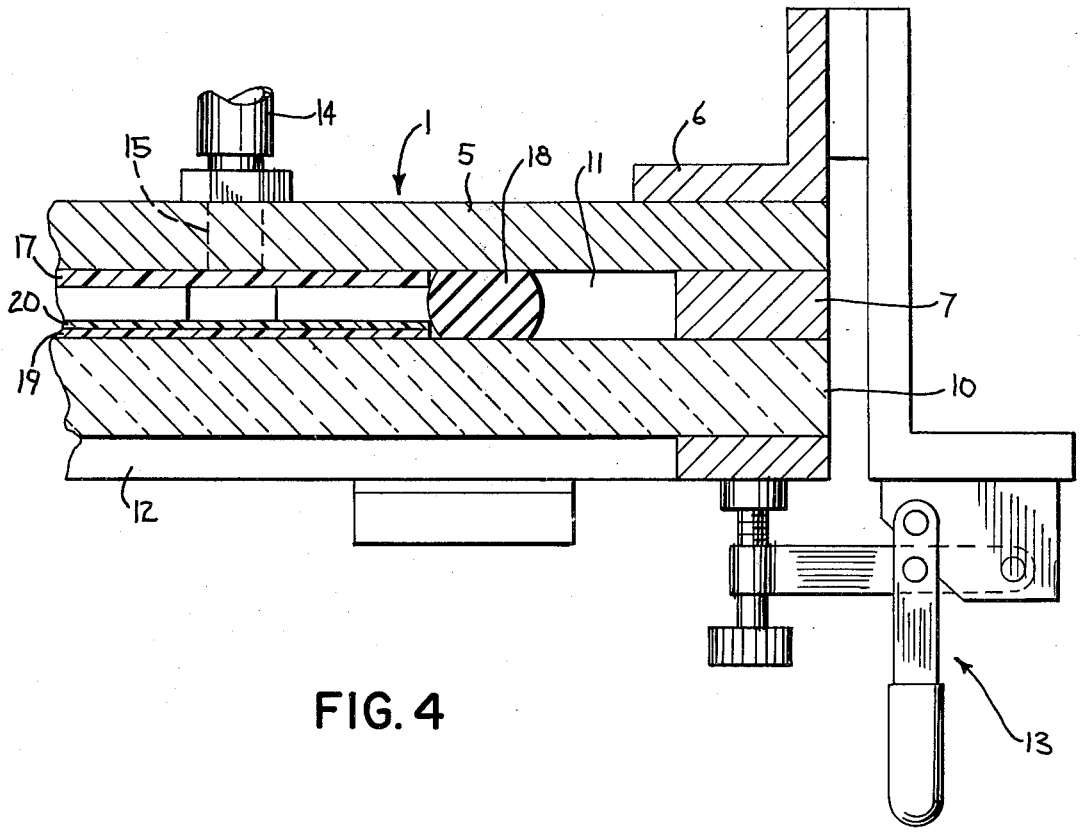
FIG. 4 is a section taken along line 4—4 of FIG. 2.
Figure 5:
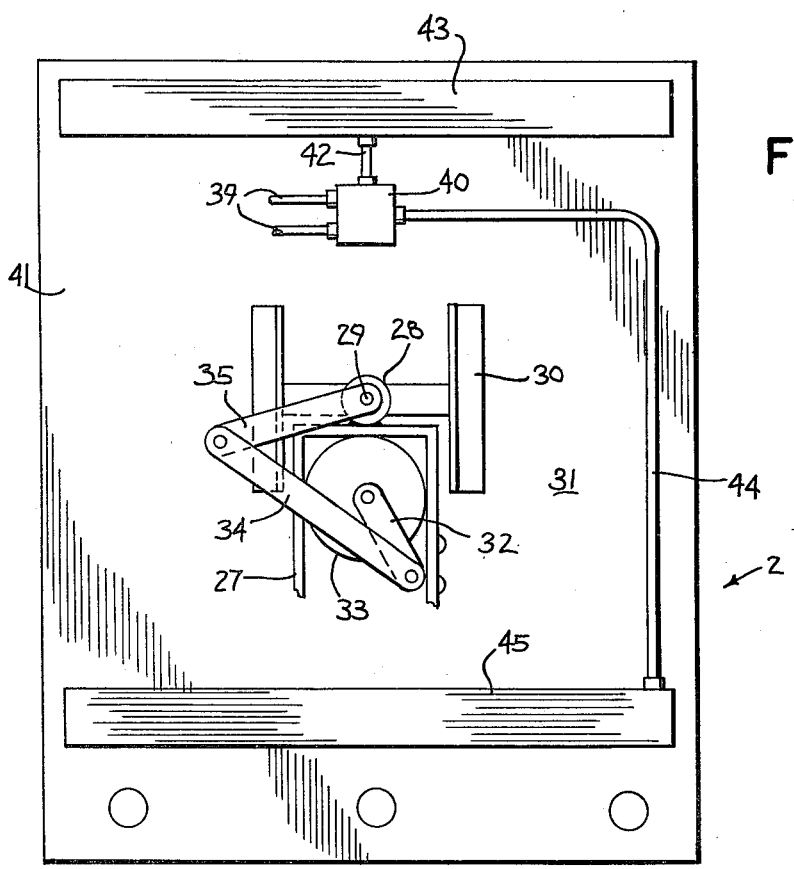
FIG. 5 is a section taken along line 5—5 of FIG. 1.

The pattern making unit 1 is composed of a supporting frame 3 which is mounted on a series of legs 4. A vertical support plate 5 extends upwardly from frame 3 and is bordered by an angle member 6, as illustrated in FIG. 4.

Mounted against the forward surface of the support plate 5 is a U-shaped spacing member 7. The lower edge of the spacing member 7 is retained within a pair of L-shaped cradles 8 which extend forwardly from the lower edge of support plate 5, while the upper ends of the spacing member 7 are held against the support plate by means of magnets 9 which are mounted on the upper edge of the support plate.

Mounted against the U-shaped spacing member 7 is a glass plate 10, and the space between the glass plate and the support plate 5 defines a chamber 11. An outer U-shaped frame member 12 is disposed flatwise against the peripheral edge of the glass plate 10, and the frame members 7 and 12, as well as the glass plate 10 are held firmly against the support plate 5 through a series of adjustable clamping members, indicated generally by 13. In practice, the clamping members are spaced along all four edges of the support plate 5. The clamping members 13 themselves are a conventional type and form no part of the present invention.

During the process of forming the printing pattern an uncured photosensitive resin is introduced into the chamber 11. In this regard, a resin delivery line 14 is connected to a suitable source of resin under pressure and is connected to an opening 15 in the lower edge portion of the support plate 5. A notch 16 in the inner spacing member 7 is aligned with the resin opening. With this construction, the liquid resin will be delivered through resin line 14 into the chamber 11. The upper end of the chamber 11 is open so that as the resin partially fills the chamber, the air will be displaced through the upper open end of the chamber.

In producing the printing pattern a backing sheet 17 of partially cured photosensitive resin is mounted against the forward surface of the support plate 5 and the size of the backing sheet will depend on the size of the printing pattern to be produced. As shown in the drawings, only a single backing sheet is located within the chamber 11 and the sheet occupies only a portion of the volume of the chamber. In practice, a number of backing sheets of various sizes and configurations can be mounted on the support plate 4 in the chamber 11.

To limit the amount of resin used in the pattern making operation, resilient sealing strips 18, formed of foam plastic, or the like, are located along the vertical edges of the backing sheet 17 and serve as dams to confine the resin to the area between the sealing strips. The number and position of the sealing strips 18 depends on the number and shape of the backing sheets which are mounted within the chamber 11.

Figure 3:
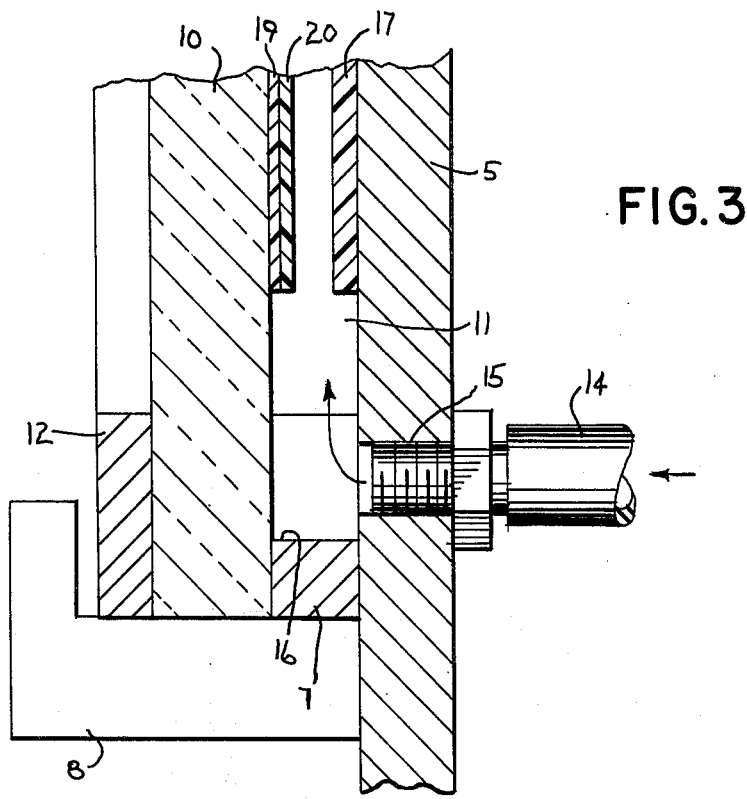
FIG. 3 is an enlarged fragmentary vertical section showing the resin chamber.

As best illustrated in FIG. 3, a photographic negative 19 is mounted on the inner surface of the glass plate 10 in alighment with the backing sheet 17 and a protective film 20 of plastic material, such as polyester film, is disposed over the negative to protect the same.

After the resin has been introduced into the chamber 11 between the glass plate 10 and the backing 17 to a level sufficient to cover the photographic negative 19 and backing 17, the portions of resin are exposed to ultra-violet light through the negative by means of the mobile lighting unit 2. The lighting unit 2 includes a frame or supporting structure 21, composed of a table 22, which is supported by a series of legs 23. Each of the legs 23 carries a caster 24 which enables the lighting unit 2 to be moved over the ground. Arms 25 extend forwardly from the frame 21 and carry a bumper 26 that is adapted to engage the legs 4 of the pattern making unit 1 to properly space the lighting unit from the pattern making unit.

Extending upwardly from the table 22 is a vertical column 27 and the upper end of the column carries a bearing assembly 28 which journals horizontal shaft 29. The forward end of shaft 29 is secured to a generally H-shaped bracket 30 mounted on the back wall of housing 31.

The shaft 29 is adapted to be oscillated about its axis through an arc of about 90° by means of a crankarm mechanism. In this regard, a link 32 is pivotally connected to the end of the drive shaft of motor 33, which is mounted within the column 27. The opposite end of link 32 is connected to one end of an arm 34 and the other end of the arm is connected through link 35 to the shaft 29. With this drive, the shaft 29 and the housing 31 will be oscillated about the axis of shaft 29 through an arc of about 90°.

Figure 6:
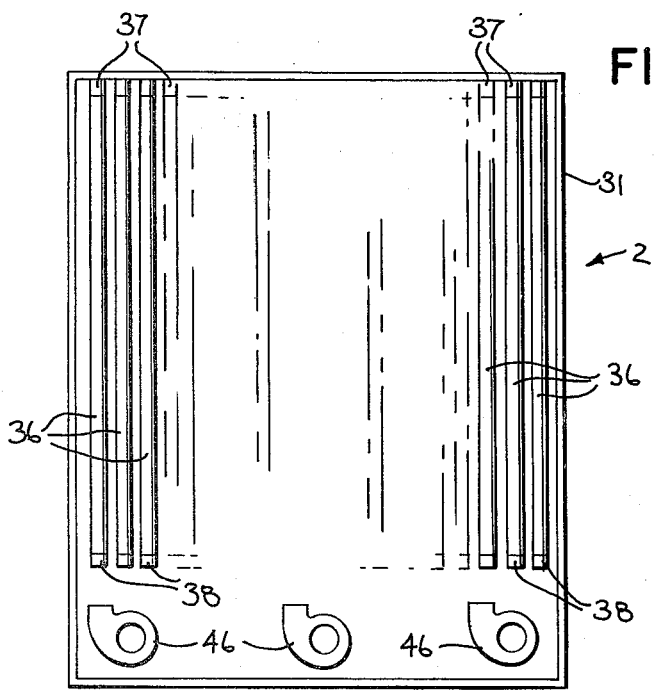
FIG. 6 is an end view of the lighting unit.

A series of fluorescent tubes 36 are mounted vertically within the housing 31, as shown in FIG. 6. One end of each tube is connected to a socket 37, while the opposite end of each tube is connected to a socket 38. To provide the electrical connection to the sockets 37 and 38, electrical lines 39 are connected to junction box 40 mounted on the rear surface 41 of housing 31 and line 42 connects the junction box to a header 43 which is connected to sockets 37, while line 44 is connected to header 45 which in turn is connected to the lower sockets 38.

As a substantial amount of heat is generated when the tubes 36 are illuminated, a series of fans 46 are mounted in the wall 41 beneath the tubes. As shown in FIG. 6, the outlet of each of the fans or blowers 46 is directed upwardly so that air will be discharged over the tubes 36 to cool the same.

Figure 7:
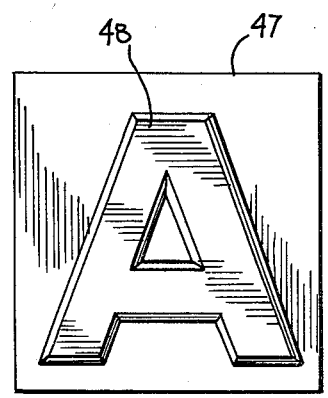
FIG. 7 is a front elevation of a pattern formed through use of the invention.

The ultra-violet lighting unit 2 acts to cure or crosslink those portions of the resin which are exposed through the photographic negative 19 to produce a relatively hard structure, while the unexposed portions of the resin remain in a liquid or gel-like state. A pattern 47 produced by the invention is shown in FIG. 7. The oscillation of the lighting housing 37 insures that all edges of each of the characters 48 of the pattern will be uniformly tapered, so that subsequently, when the pattern is used to prodice a mold, the mold can be readily parted from the pattern. The taper also serves to prevent wobble of small characters in the rubber printing plate during printing.

After the desired period of exposure, depending on the size and configuration of the characters on the negative, the clamps 13 are released, the glass plate 10 is withdrawn from the cradles 8 and the molded pattern is removed. Any uncured resin can be removed from the pattern by washing with a suitable solvent solution.

OPERATION

The resin backing sheet 17 is initially cast as the first step in the operation. It is usually desirable to have a relatively thin backing and characters or indicia of greater depth. Thus, the spacing members 7 and 12 are preferably formed with different thicknesses and the thicker spacing member 7 is positioned between the glass plate 10 and support plate 5 to define chamber 11 when forming the outer portion of the pattern and the thinner spacing member is used to define the chamber when forming the backing sheet. In either case, the overall thickness of the composite structure, i.e. the glass plate 10 and spacing members 7 and 12, is the same so that the clamps 13 can be used for both operations without adjustment.

To form the backing sheet 17, the thinner spacing member 12 is placed against the support plate 5 and if the backing sheet is not intended to be the full size of the support plate 5, sealing strips 18 are positioned against the plate to delineate the size of the backing sheet 17 to be molded. The glass plate 10 and spacing member 7 are positioned in the cradles 8 and clamped to the support plate 5 by operation of clamps 13.

The uncured photosensitive resin is then introduced into the chamber 11 through the resin line 14 and fills the compartment between the sealing strips. When the resin has reached the desired level, the lighting unit 2 is energized and the resin is exposed to the ultra-violet light for a period sufficient to partially cure the resin. In practice, the resin is exposed to the ultra-violet light for a period of about 2 minutes to provide the partial cure.

In some instances, it may be desired to provide the backing sheet 17 with a textured outer surface against which the outer portion of the pattern is subsequently molded. To provide this textured surface, a sheet of plastic film having the desired texture can be applied to the inner surface of the glass plate facing the chamber 11. The film can be applied to the glass plate by cleaning the plate with a detergent solution and applying the film to the wet solution with a squeegee action. This insures that the film will be tightly bonded to the glass plate and eliminates air pockets.

After curing of the backing sheet 17, the spacing members 7 and 12, along with the glass plate 10 are removed.

To cast the outer portion of the pattern, the spacing members are reversed with the thicker spacing member 7 being mounted against the support plate 5 to provide a deeper chamber 11, as shown in FIG. 3. If the backing sheet 17 is substantially the full size of the support plate 5, a group of negatives 19 can be applied throughout the surface of the glass plate 10. However, if only a single pattern is to be made, as illustrated in the drawings, a single negative 19 is applied to the glass surface in alignment with the previously cast, partially cured resin backing sheet 17. To limit the amount of resin to be used, sealing strips 18 can be applied adjacent the backing sheet 17, as shown in FIGS. 3 and 4.

The photographic negative or negatives 19 can be applied to the glass surface by washing the surface of the glass with a detergent solution and applying the negative to the wet surface with a squeegee action. The plastic film 20 can be applied over the negative in a similar manner.

With the glass plate 10 carrying the negative 19 and the protective film 10 positioned in the cradles 8, along with the spacing member 12, the composite structure is clamped to the support plate 5 by the clamps 13.

The uncured resin is then introduced through resin line 14 into the chamber 11 until the resin reaches a level above the photographic negative 19.

The lighting unit 2 is then moved into position adjacent the pattern making unit 1 and the bumper 26 engages the legs 4 to position the lighting unit approximately 20 inches from the glass plate. Through operation of the motor 33, the housing 31 and lights 36 are rotated about the axis of shaft 29 and the rotation will insure that all edges of each of the characters will be uniformly tapered. The resin will normally be exposed to the light for a period of about 3 minutes to fully cure the resin, but the time of exposure depends on the shape and dimension of the characters or indicia on the negative. When the negative contains characters of substantially different sizes, it may be necessary to black out certain areas of the negative which have had the desired amount of exposure and to continue to expose areas requiring additional exposure time. The blacking out can be done by merely painting the outer surface of the glass plate with black paint. During the exposure to light the partially cured resin of the backing sheet 17 will fully cure to provide an integral bond between the backing sheet 17 and the forward portion of the pattern.

After the resin has fully cured, the clamps 13 are released and the glass plate is removed to release the pattern 47, as shown in FIG. 7. Any uncured resin can then be washed from the pattern by a suitable solvent solution.

The invention provides an inexpensive method of producing patterns of various sizes and thicknesses using a liquid photosensitive resin system. By varying the spacing between the glass plate 10 and the supporting plate 5 and by varying the thickness of the backing sheet 17, the thickness of the pattern, as well as the depth of the characters can be conveniently varied.

The resin backing sheet 17 is intimately bonded through fusion to the forward portion of the pattern, thereby eliminating any problems of the molded material separating from the backing member.

As the photographic negative 19 is positioned in a vertical attitude against the glass plate 10, it is in an accessible location, so that certain areas of the negative can be blacked out, as required, to vary the time of exposure to the lighting unit.

The mobile lighting unit with the oscillating feature insures that controlled lighting is obtained to provide uniform taper on all edges of the characters.

Various modes of carrying out the invention are contemplated as being within the scope of the following claims particularly pointing out and distinctly claiming the subject matter which is regarded as the invention.

I claim:

1. An apparatus for producing printing patterns through use of a liquid uncured photosensitive resin, comprising a supporting structure including a supporting surface disposed at an angle to the horizontal, a transparent plate spaced from the surface to provide a chamber therebetween, a photographic negative containing indicia and disposed on a surface of the transparent plate, resin supply means for introducing a liquid uncured photosensitive resin into the chamber at a level beneath the negative to cover at least a portion of the negative, a lighting unit for exposing portions of the resin in said chamber through the photographic negative to ultra-violet light to thereby cure said portions and produce a hardened pattern having offset indicia, and means for providing relative reciprocating movement between said lighting unit and said support structure to obtain substantially uniform taper on the edges of said offset indicia.

2. The apparatus of claim 1, wherein said means for providing relative movement comprises means for oscillating the lighting unit about a horizontal axis.

3. The apparatus of claim 2, wherein said lighting unit includes a series of fluorescent tubes disposed in a generally vertical plane.

4. The apparatus of claim 1, and including a backing sheet composed of partially cured photosensitive resin disposed on said supporting surface and aligned with said photographic negative, exposure to said lighting unit completely curing said partially cured resin of the backing sheet to bond the backing sheet to said hardened pattern.

5. The apparatus of claim 1, and including a spacing member disposed between said supporting surface and the transparent plate to space said members apart and define said chamber.

6. The apparatus of claim 1, and including sealing means disposed within the chamber and bordering said negative to define a compartment within said chamber, said compartment communicating with said resin supply means.

7. The apparatus of claim 1, and including a first spacing member and a second spacing member, said second spacing member having a lesser thickness than the first spacing member, one of said spacing members being disposed between the transparent plate and said supporting surface to define said chamber, and the other of said spacing members being disposed on the outer surface of said transparent plate, said transparent plate and said spacing members comprising a composite structure, and clamping means for clamping the composite structure to said supporting structure, said spacing members being interchangeable in position to thereby vary the depth of the chamber.

8. The apparatus of claim 7, wherein said spacing members have a generally U-shape with an open top.

9. An apparatus for producing printing patterns through use of a liquid uncured photosensitive resin, comprising a supporting structure including a generally vertical supporting surface, a glass plate disposed parallel to said supporting surface, a generally U-shaped spacing member disposed between the supporting surface and the plate to define a chamber between the plate and the supporting surface, a photographic negative containing indicia and disposed on the surface of the glass plate facing said supporting surface, a partially cured resin backing sheet disposed on said supporting surface and located in aligned spaced relation to said negative, resin supply means for introducing a liquid uncured photosensitive resin into the chamber to cover the negative of said backing sheet, and a lighting unit for exposing portions of the resin in said chamber through said photographic negative to ultra-violet light to thereby cured said portions and produce a hardened pattern having off-set indicia.

10. The apparatus of claim 9, and including means for providing relative movement between said lighting unit and said support structure to obtain substantially uniform taper on the edges of said offset indicia.

11. The apparatus of claim 10, wherein said means for providing relative movement comprises means for oscillating the lighting unit about an axis.

12. A method of producing printing patterns using a liquid photosensitive resin, comprising the steps of mounting a transparent surface in spaced parallel relation to a generally vertical supporting plate to provide a closed chamber therebetween, introducing a liquid uncured photosensitive resin into said chamber, exposing said resin in the chamber to ultraviolet light for a sufficient period of time to partially cure the resin and provide a partially cured backing sheet, removing the transparent surface from engagement with the backing sheet, mounting a photographic negative on said transparent surface and positioning said transparent surface in spaced relation with said supporting plate to provide a second closed chamber therebetween having a greater depth than said first chamber, aligning said negative with said backing sheet, introducing a liquid uncured photosensitive resin into said said chamber, exposing a portion of said resin through said photographic negative to ultra-violet light to thereby crosslink said portion and provide a hardened pattern having offset indicia, removing the pattern from the second chamber, and removing the uncured resin from the pattern.

13. The method of claim 12, wherein said step of exposing portions of said resin to ultra-violet light comprises mounting a lighting unit in spaced relation to said negative and oscillating the lighting unit relative to said negative to thereby provide a uniform taper on the edges of the off-set indicia.

14. The method of claim 13, wherein said step of oscillating the lighting unit comprises oscillating the lighting unit about a generally horizontal axis and through an arc of about 90°.

* * * * *

UNITED STATES PATENT AND TRADEMARK OFFICE
CERTIFICATE OF CORRECTION

PATENT NO. : 4,311,381
DATED : January 19, 1982
INVENTOR(S) : DANIEL R. NETTESHEIM ET AL It is certified that error appears in the above-identified patent and that said Letters Patent are hereby corrected as shown below:

Col. 4, line 39, Cancel "prodice" and substitute therefor ---produce---; Col. 5, line 47, Cancel "10" and substitute therefor ---20---; Col. 6, line 35, Cancel "I" and substitute therefor ---We---; Col. 7, line 40, CLAIM 9, Cancel "of" and substitute therefor ---and---; Col. 8, line 1, CLAIM 9, Cancel "cured" and substitute therefor ---cure---; Col. 8, line 26, CLAIM 12, Cancel "said", first occurrence.

Signed and Sealed this

Eighth Day of February 1983

[SEAL]

Attest:

*Attesting Officer*

GERALD J. MOSSINGHOFF
*Commissioner of Patents and Trademarks*